US011444590B2

(12) United States Patent
Shen et al.

(10) Patent No.: US 11,444,590 B2
(45) Date of Patent: Sep. 13, 2022

(54) CLASS-G CONTROL SYSTEM WITH LOW LATENCY SIGNAL PATH

(71) Applicant: SYNAPTICS INCORPORATED, San Jose, CA (US)

(72) Inventors: Dan Shen, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 33 days.

(21) Appl. No.: 17/118,411

(22) Filed: Dec. 10, 2020

(65) Prior Publication Data
US 2021/0184638 A1    Jun. 17, 2021

Related U.S. Application Data

(60) Provisional application No. 62/948,769, filed on Dec. 16, 2019.

(51) Int. Cl.
*H03F 3/217* (2006.01)
*G10K 11/178* (2006.01)
*H04R 3/00* (2006.01)

(52) U.S. Cl.
CPC ..... *H03F 3/2175* (2013.01); *G10K 11/17855* (2018.01); *H04R 3/00* (2013.01); *G10K 2210/3016* (2013.01); *G10K 2210/3056* (2013.01); *H03F 2200/03* (2013.01); *H03F 2200/102* (2013.01)

(58) Field of Classification Search
CPC ............... H03F 3/2175; H03F 2200/03; H03F 2200/102; G10K 11/17855; G10K 2210/3016; G10K 2210/3056; H04R 3/00
See application file for complete search history.

(56) References Cited

U.S. PATENT DOCUMENTS

| 7,782,141 | B2* | 8/2010 | Witmer | H03F 3/68 330/297 |
|---|---|---|---|---|
| 2009/0220110 | A1* | 9/2009 | Bazarjani | H03F 1/0211 381/120 |
| 2010/0219888 | A1* | 9/2010 | Lesso | H03G 3/001 330/136 |
| 2011/0058688 | A1* | 3/2011 | Yoon | H03F 1/0211 381/104 |
| 2015/0263686 | A1* | 9/2015 | Lesso | H03G 3/001 341/144 |

(Continued)

*Primary Examiner* — David L Ton
(74) *Attorney, Agent, or Firm* — Paradice & Li LLP

(57) ABSTRACT

Systems and methods include a digital control module that receives and processes audio data for output through a loudspeaker. An analog block receives the audio data and the power control signal and amplifies the audio data for output. A first processing path includes a buffer to delay the audio data, a first component to combine the buffered audio data and anti-noise. A second processing path includes an absolute value block to receive the audio data and an envelope detector to receive the absolute value data and generate a maximum value for the envelope. An anti-noise path includes an absolute value block configured to determine an anti-noise absolute value which is combined with the absolute value anti-noise data. A power generator receives the output from the envelope detector and updates a power level to approximate a minimum powered needed to process the audio signal.

19 Claims, 5 Drawing Sheets

(56) References Cited

U.S. PATENT DOCUMENTS

2017/0310288 A1\* 10/2017 Das ........................ H03F 1/305
2018/0205347 A1\* 7/2018 Das ........................ H02M 3/07
2019/0149096 A1\* 5/2019 Zhu ...................... H03G 3/3005
                                                              330/278
2020/0005802 A1\* 1/2020 You ........................ H03G 7/007

\* cited by examiner

CLASS-G CONTROL SYSTEM WITH LOW LATENCY SIGNAL PATH

CROSS-REFERENCE TO RELATED APPLICATIONS

This application claims priority to and the benefit of U.S. Provisional Patent Application No. 62/948,769 filed Dec. 16, 2019, entitled "CLASS-G CONTROL SYSTEM WITH LOW LATENCY SIGNAL PATH", which is hereby incorporated by reference in its entirety.

TECHNICAL FIELD

The present disclosure, in accordance with one or more embodiments, relates generally to amplifiers and, more particularly for example, to an audio amplifier with improved loop response.

BACKGROUND

Many modern devices such as laptop computers, computer tablets, MP3 players, and smart phones provide for speaker and headphone connectivity utilizing internal audio amplifiers. Class-D amplifiers are commonly used to drive these speakers and headsets. A class-D amplifier has higher efficiency than a class-AB amplifier and can meet performance criteria for mobile devices including low power consumption, linearity and latency requirements. Due to miniaturization of modern devices and increased performance requirements, there is a continued need to improve power consumption, linearity, and latency in audio amplifiers.

SUMMARY

The present disclosure provides systems and methods that address a need in the art for improved performance of audio amplifiers. In various embodiments, the power supplied to an audio amplifier is adaptively adjusted based on the input or output audio signal level to reduce power consumption. By limiting the power supplied to the amplifier to the voltage needed for operation, the audio amplifiers of the present disclosure can achieve high performance in a low power environment.

In various embodiments, a method for processing an audio input signal on a first processing path comprises buffering the audio input signal, combining the buffered audio input signal with a second channel of audio data in a low-latency path to produce a first combined audio output signal, and providing the first combined audio output signal to an audio output drive. The method further comprises processing the audio input signal on a second processing path comprising determining an absolute value of the audio input signal, combining the absolute value of the audio input signal with an absolute value of the second channel of audio data in a mix to generate a second combined audio output signal, determining an envelope for the second combined audio output signal; and adjusting a power supplied to the audio driver based on the determined envelope.

The audio input signal may be a digital audio stream for playback on a loudspeaker. In some embodiments, the second channel of audio data may comprise noise cancellation data and the method may further comprise generating a noise cancellation signal from the noise cancellation data to cancel detected ambient noise. Buffering the audio input signal may comprise delaying the processing of the audio input signal in the first processing path such that the power supplied to the audio driver from the second processing path and the audio signal supplied to the audio driver from the first processing path are received by the audio driver at approximately the same time.

In some embodiments, the method may further comprise determining an absolute value of the second channel of audio data, predicting a maximum value of the second channel of audio data, and/or processing the first combined audio output signal to drive a loudspeaker. The maximum value of the second channel of audio data may be calculated, based at least in part, on a slope of the second channel of audio data over time. Processing the first combined audio output signal may comprise converting the first combined audio output signal from digital to analog, such as by passing the analog signal through a class AB amplifier or a class D amplifier.

In various embodiments, a system for processing audio input data comprises a digital control module configured to receive and process audio data on a first processing path to generate audio output and process the audio data on a second processing path to generate a power control signal based on a predicted amplitude of the generated audio output, and an analog block configured to receive the audio output and the power control signal and amplify, based at least in part on the power control signal, the audio output for playback on a loudspeaker.

In some systems, the first processing path comprises a buffer configured to receive and delay the audio data and output buffered audio data, and the first processing path may comprise a first component configured to receive the buffered audio data and a second channel of data and combine the buffered audio data and the second channel of data for output to the audio block.

In some systems, the digital control module further comprises a second processing path comprising an absolute value block configured to receive the audio data and output an audio signal absolute value, and an envelope detector configured to receive the absolute value data and generate a maximum value for the envelope. The system may further comprise a third processing path configured to process a second channel of data comprising an absolute value block configured to determine an absolute value of the second channel of data, and the second processing path may further comprise a second component configured to combine the absolute value of the second channel of data and the absolute value data prior to input to the envelope detector with a mix that may differ from an actual output signal.

In some embodiments, the system further comprises a power generator configured to receive the output from the envelope detector and update a power level to approximate a maximum power required to process the audio signal. The received audio signal may be buffered and delayed before output and the power control signal is generated without a delay. The digital control module may further comprise a maximum value block configured to receive a second channel of data and generate a predicted maximum value, and the predicted maximum value may be generated based on a slope of the second channel of data. In some systems, the digital control module is further configured to receive and process a second channel of data in a low latency data path, and the predicted amplitude of the output signal may be based on a slope of the second channel of data.

In some embodiments, the analog block comprises a digital to analog converter configured to receive the audio data and output an analog representation of the audio data, an amplifier configured to receive and amplify the analog representation of the analog data, and a loudspeaker configured to receive and amplified signal and generate a sound for a user.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The present disclosure provides systems and methods that address a need in the art for improved performance of audio amplifiers used in low power devices. The audio amplifiers disclosed herein can consume less power than conventional audio amplifiers while reducing delay and distortion of the audio output.

In one embodiment, a class-G operation adjusts the power supplied to an audio amplifier based on the input or output signal level, limiting power consumption to the voltage headroom needed for operation. For a given output current, the power consumed by the amplifier may be estimated using Iout*Pvdd. Therefore, power consumption of the amplifier can be minimized by reducing Pvdd.

The ability of a system to switch the supplied power level in response to an audio signal level may be limited by the power generator speed, such as low dropout (LDO) or DC-DC converter. Further, switching the power supply cannot be done instantly. If power supply is kept low and the signal level quickly increases such that the signal amplitude is more than the Pvdd level, the output will be clipped resulting in signal distortion. If the Pvdd level is kept high to accommodate the varying signal levels, then power consumption will increase. In some embodiments, a buffer may be placed along the audio signal path so that the audio signal level increase can be predicted ahead of time to give the power generator enough time to switch the power supply level. Additional modifications are disclosed for systems that have two paths or more.

Embodiments of the present disclosure will now be described with reference to the figures. A class-G system is configured to adjust the power supplied to the amplifier based on the input or output signal level to save power consumption by only giving the amplifier the voltage headroom needed to accommodate the signal. For a given output current, power consumed is about Iout*Pvdd, therefore power consumption can be minimized by reducing Pvdd.

The speed of the power supply change is limited by the power generator speed (e.g., LDO or DC-DC converter), and therefore switching the power supply cannot be done instantly. If the power supply is kept low, then sudden signal level increases where the signal amplitude is more than the Pvdd level, will cause the output to be clipped and creation of signal distortion. In some embodiments, a buffer may be placed along the signal path so that the signal level increase can be detected ahead of actual output amplitude increase to give the power generator extra time to switch the power supply up.

Figure 1:
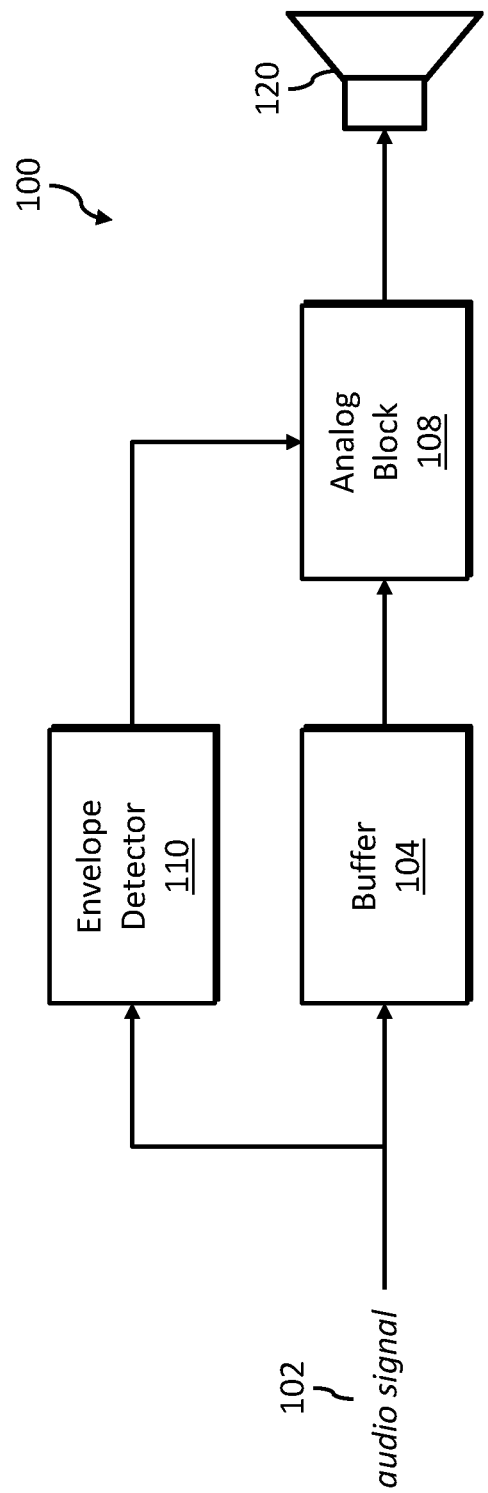
FIG. 1 illustrates an example audio output stage, in accordance with one or more embodiments of the present disclosure.

An embodiment of this approach is illustrated in FIG. 1. An audio output stage 100 receives an audio signal 102, which is passed to a buffer 104 and an envelope detector 110. The buffered audio signals are provided to an analog block for output to a loudspeaker 120. The analog block 108 includes an amplifier for amplifying the audio signal to drive the loudspeaker 120. The envelope detector 110 generates a signal based on amplitude variations of the audio signal to control the power consumed by the analog block 108 (e.g., by minimizing the supplied voltage to an estimate of what is needed to process the buffered audio signal). The buffer 104 provides a short delay in the signal path so that the change in the power level can be effected before the corresponding audio signal is processed.

The approach of FIG. 1 introduces some latency to the overall signal path through the use of the buffer 104 and may not be desirable for systems that require low latency. For example, in an active noise cancellation (ANC) system, it is desirable to design a noise cancellation path having very low latency (e.g., as low as possible) to get the best noise cancellation result. One solution is to disable class-G power reduction features in an ANC system to reduce the latency and improve performance. Other solutions are presented herein that can support both low latency ANC applications and class-G power reduction at the same time.

Figure 2:
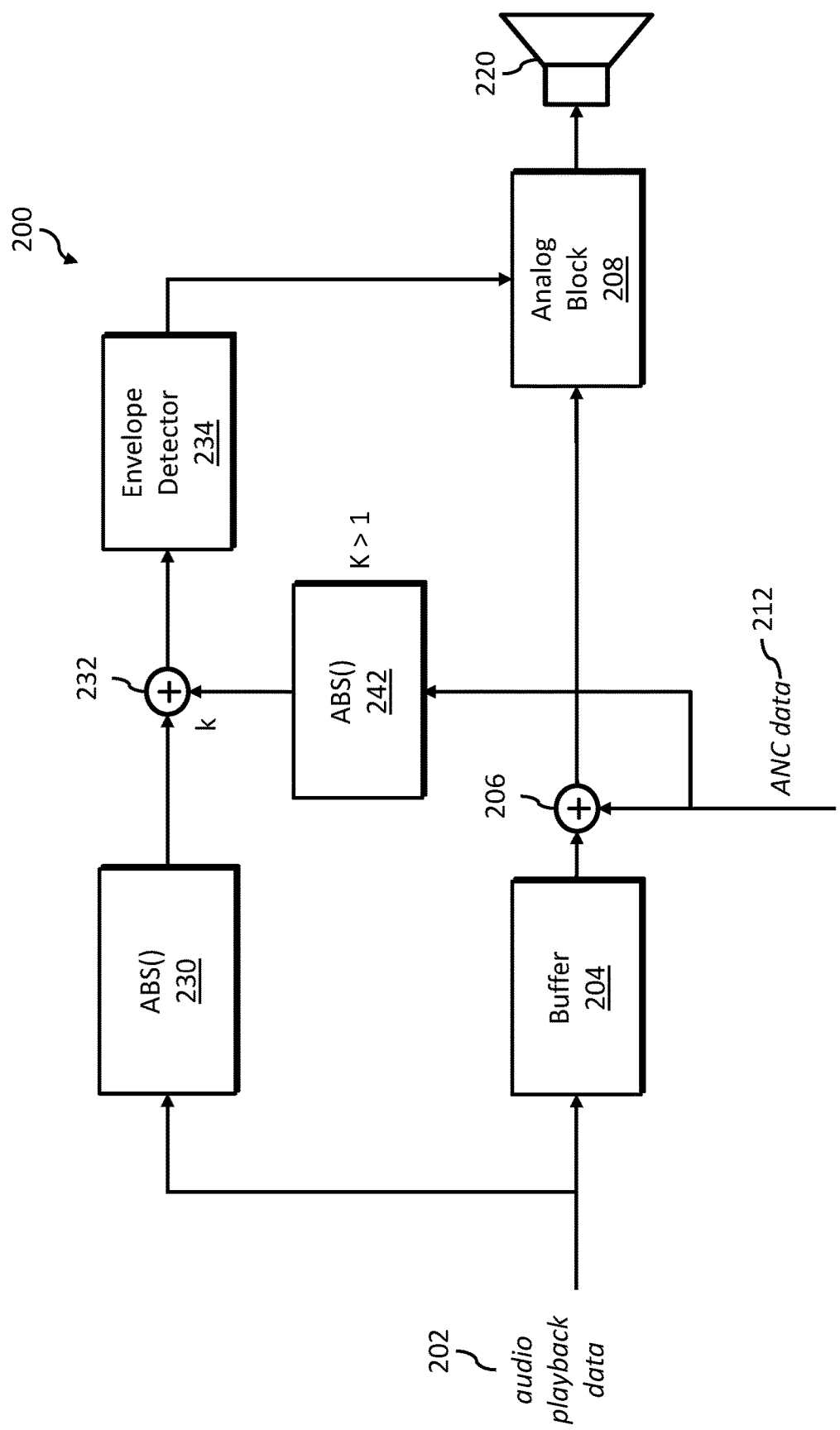
FIG. 2 illustrates an example audio output stage for an active noise cancellation system, in accordance with one or more embodiments of the present disclosure.

Referring to FIG. 2, an embodiment of an architecture supporting both low latency ANC applications and class-G power reduction will now be described. The system 200 receives audio playback data 202, such as a digital audio signal received from storage or an input stream, for output through a loudspeaker 220. The audio playback data 202 is buffered through buffer 204 to introduce a short delay to accommodate the envelope detector 234 and switching of the power provided to the analog block 208. ANC data 212 comprises an anti-noise signal for playback through the loudspeaker 220 to cancel and/or suppress ambient noise. As illustrated, the buffered audio playback data is combined with the ANC data 212 through component 206 and input to the analog block 208 for further processing and amplification to drive the loudspeaker 220. By combining the ANC data 212 with the audio playback data 202 after buffering, the latency introduced by the power switching components won't affect ANC performance. The ANC data 212 is also provided to an absolute value block 242, which outputs an absolute value of the ANC data, which is combined with an absolute value of the audio playback data through component 232 (e.g., through absolute value block 230). The combined absolute value signal is input to the envelope detector 234, which determines the amplitude and estimates the anticipated power level needed for the analog block 208 to process the buffered audio playback data 202 to reduce the power consumption of the system 200.

Figure 3:
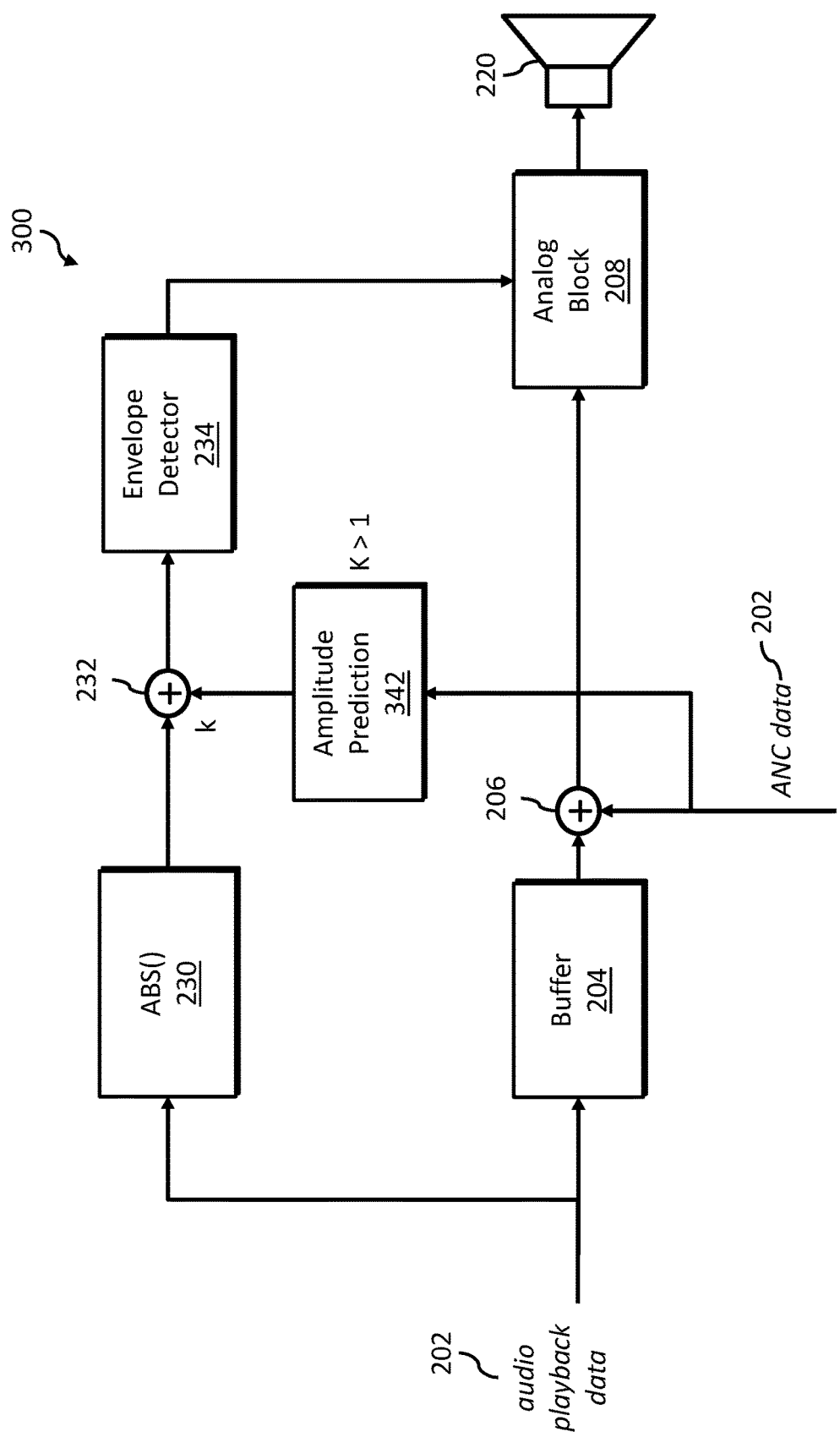
FIG. 3 illustrates an example audio output stage for an active noise cancellation system, in accordance with one or more embodiments of the present disclosure.

Referring to FIG. 3, another embodiment that combines audio playback data and ANC data will be described. In this embodiment, the system 300 includes an amplitude prediction block 342 that receives the ANC data. The amplitude prediction block 342 uses data from the last few data points to calculate a slope of the amplitude and then predict a maximum potential ANC signal for the buffered audio signal (e.g., the signal to be output the near future) based on the current rate of change. For example, the amplitude prediction block 342 can use an average signal value within 1 μs to predict the amplitude in the next 25 μs by Va=abs(V1+(V1−V2)*25 us/(1 us)), where V1 and V2 are the average of input ANC data of within the last 1 μs and average from last 2 us to last 1 μs. In this approach, a coarse guess of the low latency path signal 25 μs later can be derived.

Advantages of the systems and methods disclosed herein will be apparent to those skilled in the art. In some embodiments, the use of a value predictor using the last few data points to calculate the slope allows the maximum value to be predicted without latency. By implementing a two-channel approach using absolute value a greater margin for error is allowed and the system and methods can be used to predict the maximum data values. The systems and methods provide more gain on low latency data when adding two channels of data together. Low power consumption and low delay are desired in many headset implementations, including ANC headsets. The system and methods disclosed herein allow class G functionality to be enabled even when used in ANC headsets, supporting both class G and ANC during operation.

Figure 4:
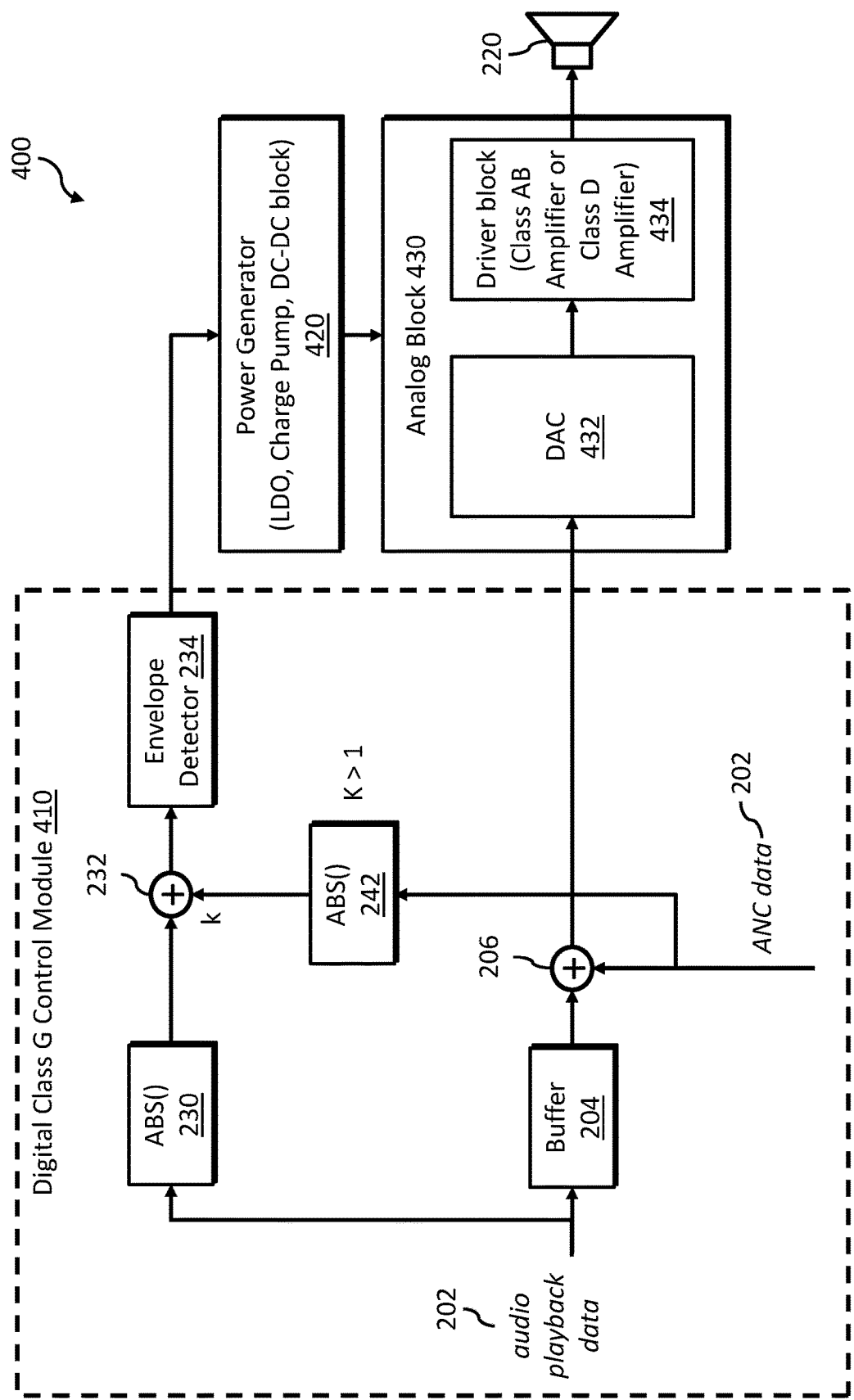
FIG. 4 illustrates an example audio output stage for an active noise cancellation system, in accordance with one or more embodiments of the present disclosure.

Referring to FIG. 4, an example implementation of the embodiment of FIG. 2 will now be described. A system 400 includes a digital class G control module 410, a power generator 420, and an analog block 430. The digital class G control module 410 includes digital logic for processing received audio playback data 202 in accordance with the embodiment of FIG. 2, including buffering the audio playback data through buffer 204 and combining the buffered audio playback data with ANC data 212 for output to the analog block 430, which drives the loudspeaker 220. The digital class G control module 410 further includes digital logic determining the absolute value of the audio playback data 202 through ABS block 230, determining an absolute value of the ANC data 212 through ABS block 242 and combining the ABS block outputs through component 232. The combined absolute value signal is input to the envelope detector 234, which determines the amplitude and signals the anticipated power level to the power generator 420 to reduce the power consumption of the analog block 430. In various embodiments, the digital class G control module 410 may include digital circuitry and/or a logic device configured to perform the processing steps disclosed herein. The logic device may include a processor (e.g., digital signal processor, microcontroller, etc.) and memory storing instructions for execution by the processor.

The power generator 420 includes circuitry such as an LDO, charge pump, DC-DC block, etc., to switch the power provided to the analog block 430 in response to the combined absolute value signal. The analog block 430 includes a digital-to-analog converter (DAC) 432 and a driver block 434. The driver block 434 includes an amplifier (e.g., a class AB amplifier, a class G amplifier, etc.) configured to receive the analog audio output signal and amplify the analog output signal to drive the loudspeaker 220.

Figure 5:
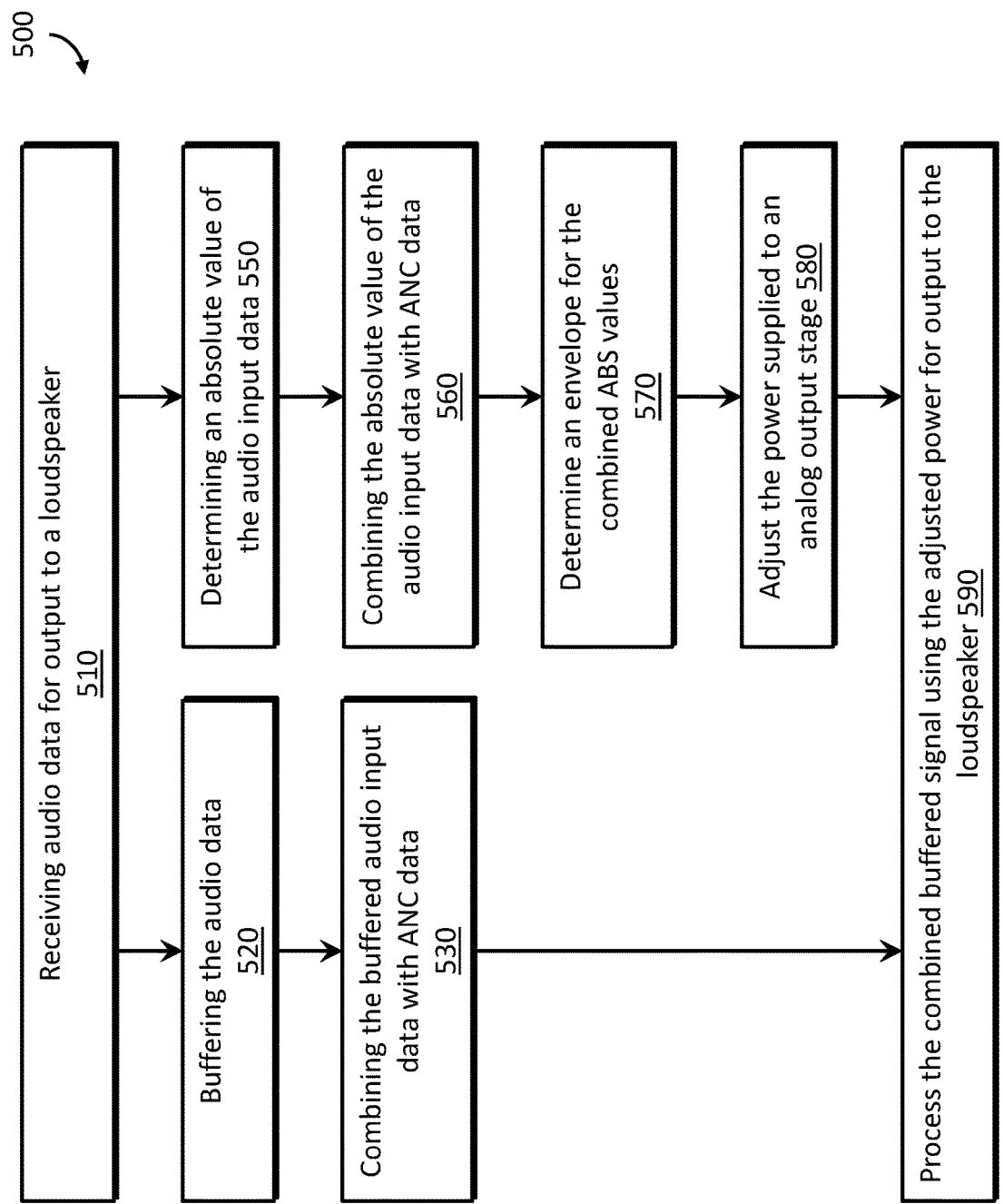
FIG. 5 is a flow diagram illustrating an example process for operating an audio output stage, in accordance with one or more embodiments of the disclosure.

Referring to FIG. 5, an embodiment of a method 500 for low power, class G operation will now be described. The method 500 starts in step 510 by receiving audio data for output to a loudspeaker. In various embodiments, the audio data is digital audio data generated by a digital signal processor and/or other processing component. The audio data is buffered in step 520 and combined with ANC data in step 530. At the same time, the audio data from step 510 is processed through a processing path that includes determining an absolute value for the audio data in step 550, combining the absolute value of the audio data with ANC data in step 560, determining an envelope for the combined ABS values in step 570, and adjusting a power supplied to an analog output stage in step 580 (e.g., based on a signal level of the audio input). In step 590, the combined buffered signal is processed through an output driver component for output to the loudspeaker.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method comprising:
   processing an audio input signal on a first processing path comprising:
      buffering the audio input signal;
      combining the buffered audio input signal with a second channel of audio data in a low-latency path to produce a first combined audio output signal; and
      providing the first combined audio output signal to an audio output driver; and
   processing the audio input signal on a second processing path comprising:
      determining an absolute value of the audio input signal;
      combining the absolute value of the audio input signal with an absolute value of the second channel of audio data in a mix to generate a second combined audio output signal;
      determining an envelope for the second combined audio output signal; and
      adjusting a power supplied to the audio driver based on the determined envelope.

2. The method of claim 1, wherein the audio input signal is a digital audio stream for playback on a loudspeaker.

3. The method of claim 1, wherein the second channel of audio data comprises noise cancellation data and wherein the method further comprises generating a noise cancellation signal from the noise cancellation data to cancel detected ambient noise.

4. The method of claim 1, wherein buffering the audio input signal comprises delaying the processing of the audio input signal in the first processing path such that the power supplied to the audio driver from the second processing path and the audio signal supplied to the audio driver from the first processing path are received by the audio driver at approximately the same time.

5. The method of claim 1, further comprising determining an absolute value of the second channel of audio data.

6. The method of claim 1, further comprising predicting a maximum value of the second channel of audio data.

7. The method of claim 6, wherein the maximum value of the second channel of audio data is calculated, based at least in part, on a slope of the second channel of audio data over time.

8. The method of claim 1, further comprising processing the first combined audio output signal to drive a loudspeaker.

9. The method of claim 8, wherein processing the first combined audio output signal comprises converting the first combined audio output signal from digital to analog.

10. The method of claim 9, wherein processing the first combined audio output signal comprises passing the analog signal through a class AB amplifier or a class D amplifier.

11. A system comprising:
   a digital control module configured to receive and process audio data on a first processing path to generate audio output and process the audio data on a second processing path to generate a power control signal based on a predicted amplitude of the generated audio output, wherein the second processing path includes:
      an absolute value block configured to receive the audio data and output an audio signal absolute value; and
      an envelope detector configured to receive the audio signal absolute value and generate a maximum value for an envelope; and
   an analog block configured to receive the audio output and the power control signal and amplify, based at least in part on the power control signal, the audio output for playback on a loudspeaker.

12. The system of claim 11, wherein the first processing path comprises a buffer configured to receive and delay the audio data and output buffered audio data.

13. The system of claim 12, wherein the first processing path further comprises:
   a first component configured to receive the buffered audio data and a second channel of data and combine the buffered audio data and the second channel of data for output to the audio analog block.

14. The system of claim 11, further comprising a third processing path configured to process a second channel of data comprising an absolute value block configured to determine an absolute value of the second channel of data; and
   wherein the second processing path further comprises a second component configured to combine the absolute value of the second channel of data and the audio signal absolute value prior to input to the envelope detector with a mix that may differ from an actual output signal.

15. The system of claim 11, further comprising a power generator configured to receive the output from the envelope detector and update a power level to approximate a maximum power required to process the audio signal.

16. The system of claim 11, wherein the received audio signal is buffered and delayed before output and the power control signal is generated without a delay.

17. The system of claim 11, wherein the digital control module further comprises a maximum value block configured to receive a second channel of data and generate a predicted maximum value; and
   wherein the predicted maximum value is generated based on a slope of the second channel of data.

18. The system of claim 11, wherein the analog block comprises:
   a digital to analog converter configured to receive the audio data and output an analog representation of the audio data;
   an amplifier configured to receive and amplify the analog representation of the analog data; and
   a loudspeaker configured to receive the amplified analog representation and generate a sound for a user.

19. The system of claim 11, wherein the digital control module is further configured to receive and process a second channel of data in a low latency data path; and
   wherein the predicted amplitude of the output signal is based on a slope of the second channel of data.

* * * * *

UNITED STATES PATENT AND TRADEMARK OFFICE
CERTIFICATE OF CORRECTION

PATENT NO. : 11,444,590 B2
APPLICATION NO. : 17/118411
DATED : September 13, 2022
INVENTOR(S) : Dan Shen et al.

Page 1 of 1

It is certified that error appears in the above-identified patent and that said Letters Patent is hereby corrected as shown below:

In the Claims

In Column 8, Line 9, Claim 13, delete "audio".

Signed and Sealed this
Twenty-fifth Day of October, 2022

Katherine Kelly Vidal
*Director of the United States Patent and Trademark Office*